United States Patent
Kim et al.

(10) Patent No.: US 8,127,071 B2
(45) Date of Patent: Feb. 28, 2012

(54) SEMICONDUCTOR MEMORY DEVICE AND BLOCK MANAGEMENT METHOD OF THE SAME

(75) Inventors: Min-Young Kim, Suwon-si (KR); Song-Ho Yoon, Yongin-si (KR); Su-Ryun Lee, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 729 days.

(21) Appl. No.: 12/202,177

(22) Filed: Aug. 29, 2008

(65) Prior Publication Data

US 2009/0059695 A1   Mar. 5, 2009

(30) Foreign Application Priority Data

Sep. 4, 2007   (KR) .................. 10-2007-0089547

(51) Int. Cl.
*G06F 12/00* (2006.01)
*G06F 13/00* (2006.01)
*G06F 13/28* (2006.01)

(52) U.S. Cl. ............... 711/103; 714/6.11; 714/6.13

(58) Field of Classification Search .......... 711/103; 714/6.11, 6.13
See application file for complete search history.

(56) References Cited

U.S. PATENT DOCUMENTS

| 2005/0144516 A1* | 6/2005 | Gonzalez et al. | 714/8 |
| 2008/0052446 A1* | 2/2008 | Lasser et al. | 711/103 |
| 2010/0088540 A1* | 4/2010 | Chu et al. | 714/5 |
| 2010/0228940 A1* | 9/2010 | Asnaashari et al. | 711/170 |

FOREIGN PATENT DOCUMENTS

| KR | 1020030014356 A | 2/2003 |
| KR | 1020030021242 A | 3/2003 |
| KR | 1020040087245 A | 10/2004 |

* cited by examiner

*Primary Examiner* — Stephen Elmore
*Assistant Examiner* — Mark Giardino, Jr.
(74) *Attorney, Agent, or Firm* — Volentine & Whitt, PLLC

(57) ABSTRACT

A semiconductor memory device includes adjacent planes and a control module. The adjacent planes include a reserve field and a data field having multiple blocks. The blocks of each of the reserve and data fields are successively arranged over the adjacent planes to form a multi-plane operation group. The control module is configured to control the adjacent planes to conduct a first operation or a second operation in accordance with whether the reserve field includes free blocks corresponding to a unit of the multi-plane operation group. The first operation includes replacing blocks of the data field with free blocks of the reserve field in the unit of the multi-plane operation group. The second operation includes replacing one block of the data field with one free block of the reserve field.

18 Claims, 13 Drawing Sheets

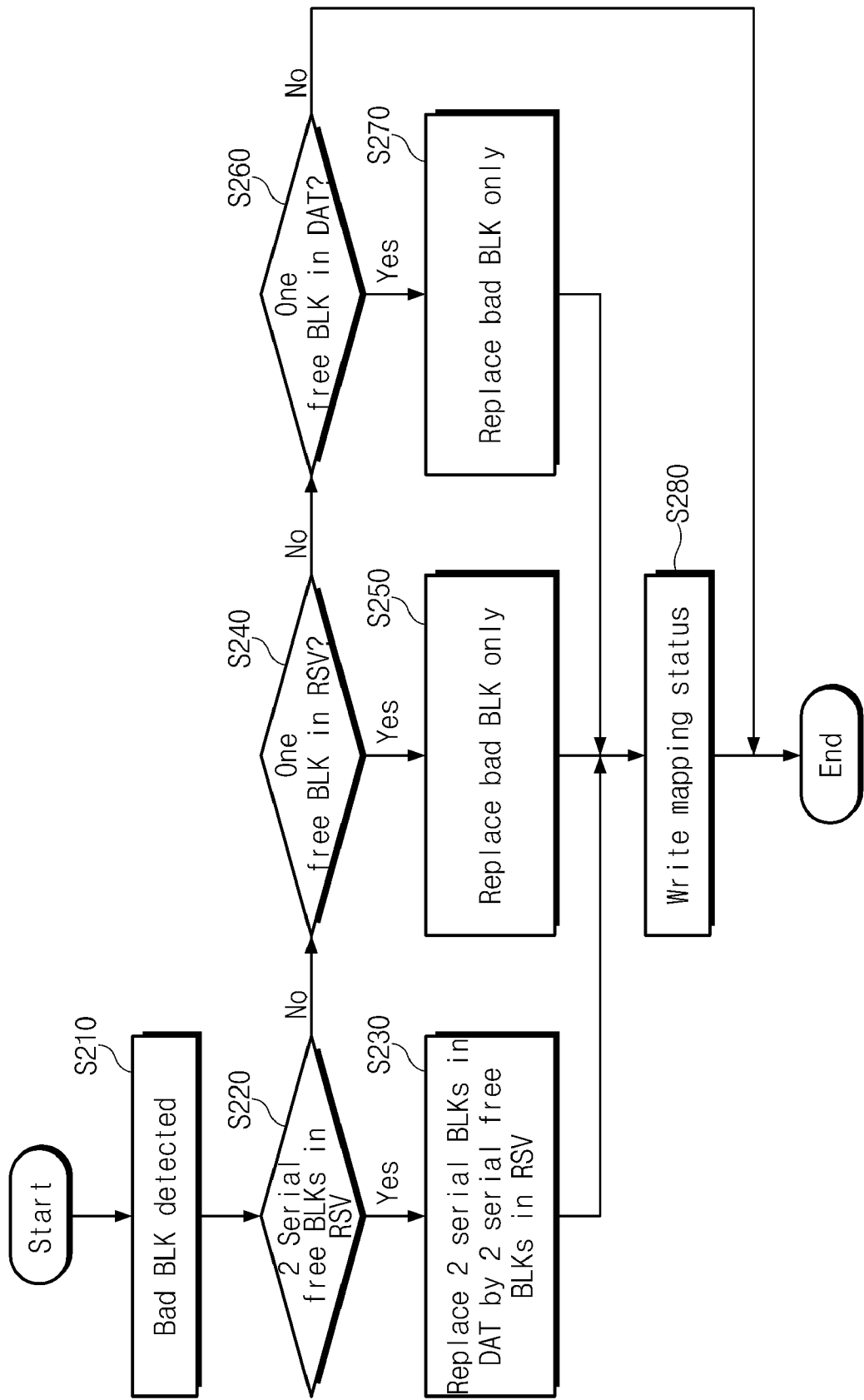

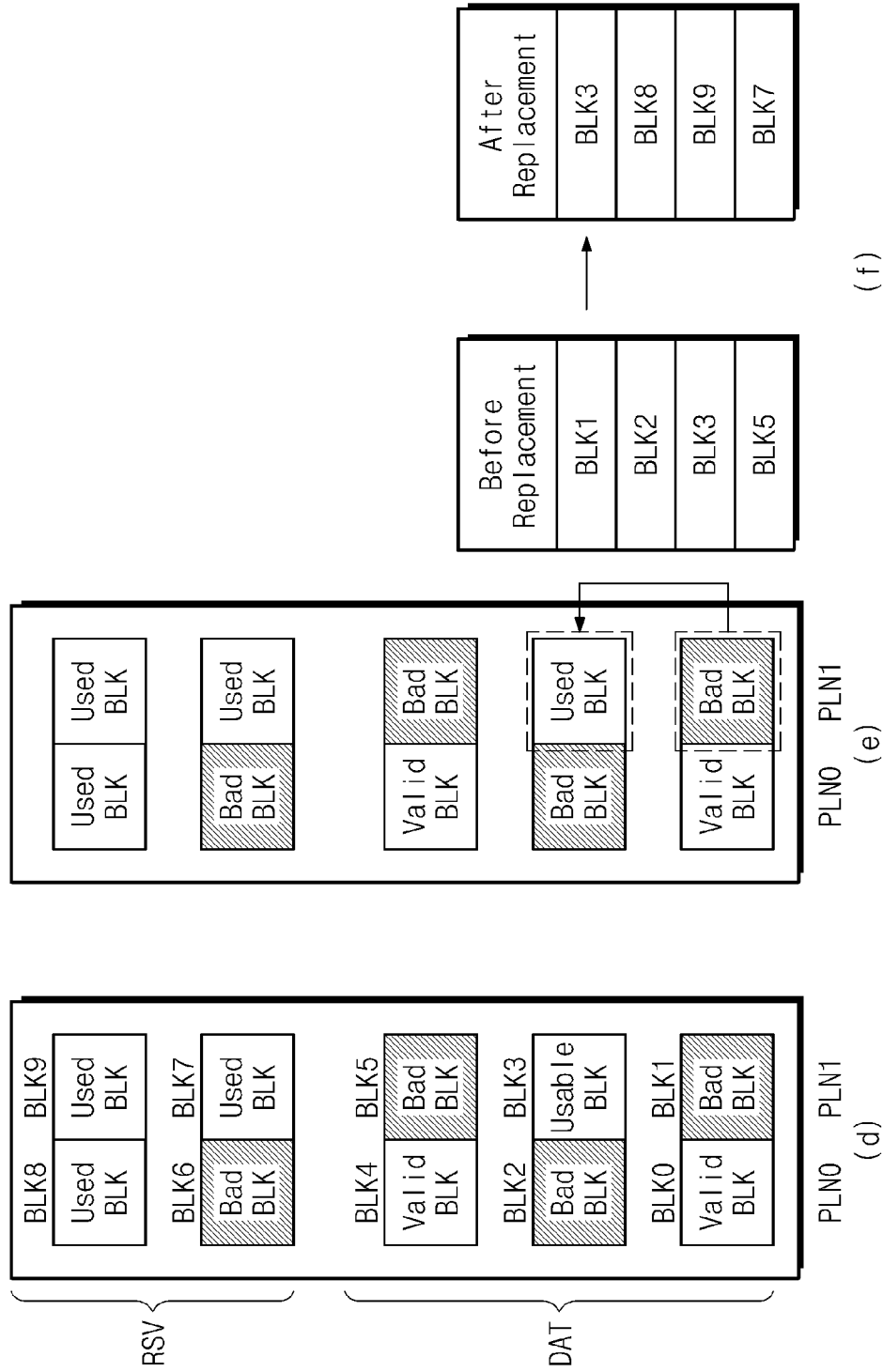

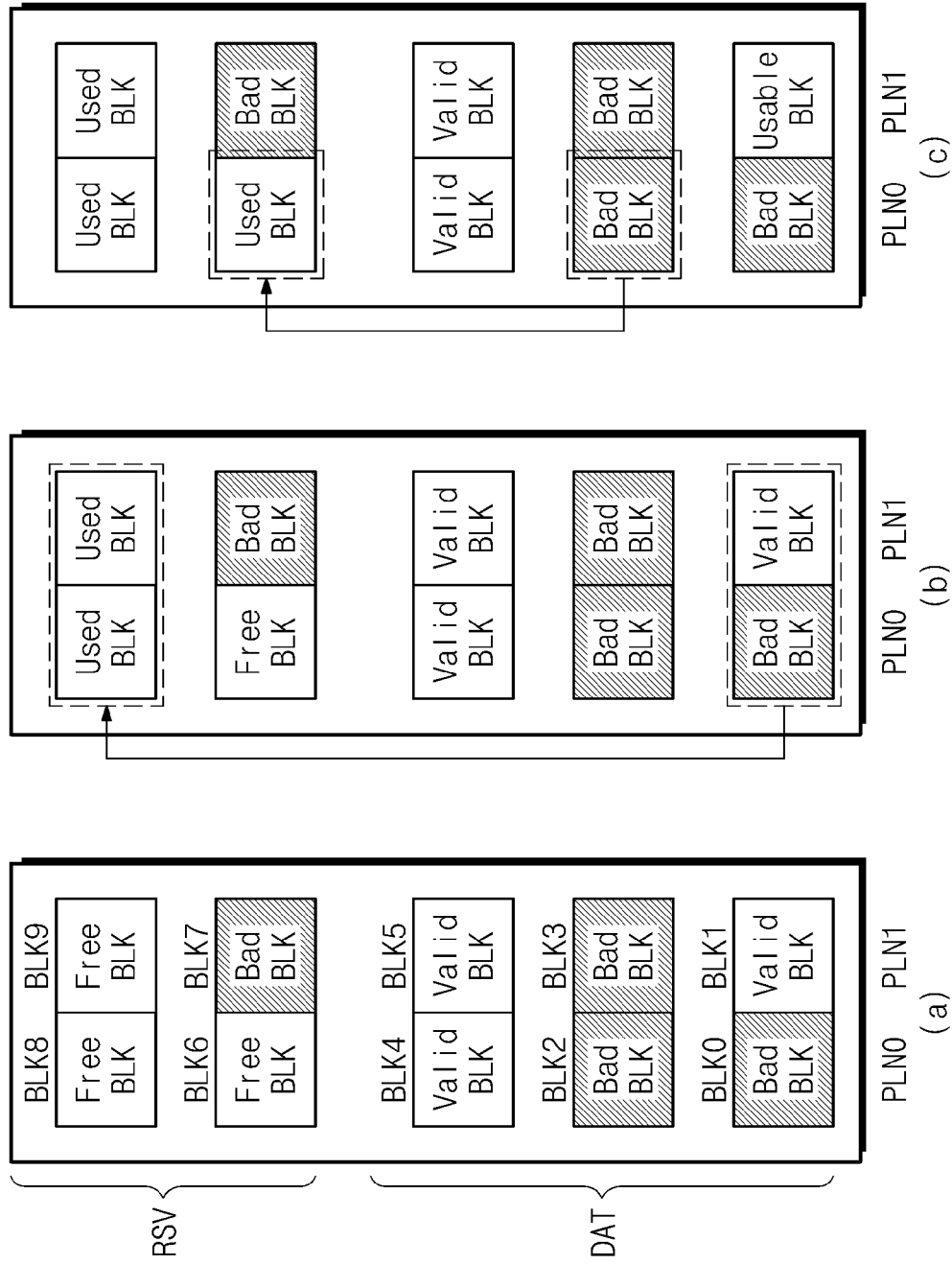

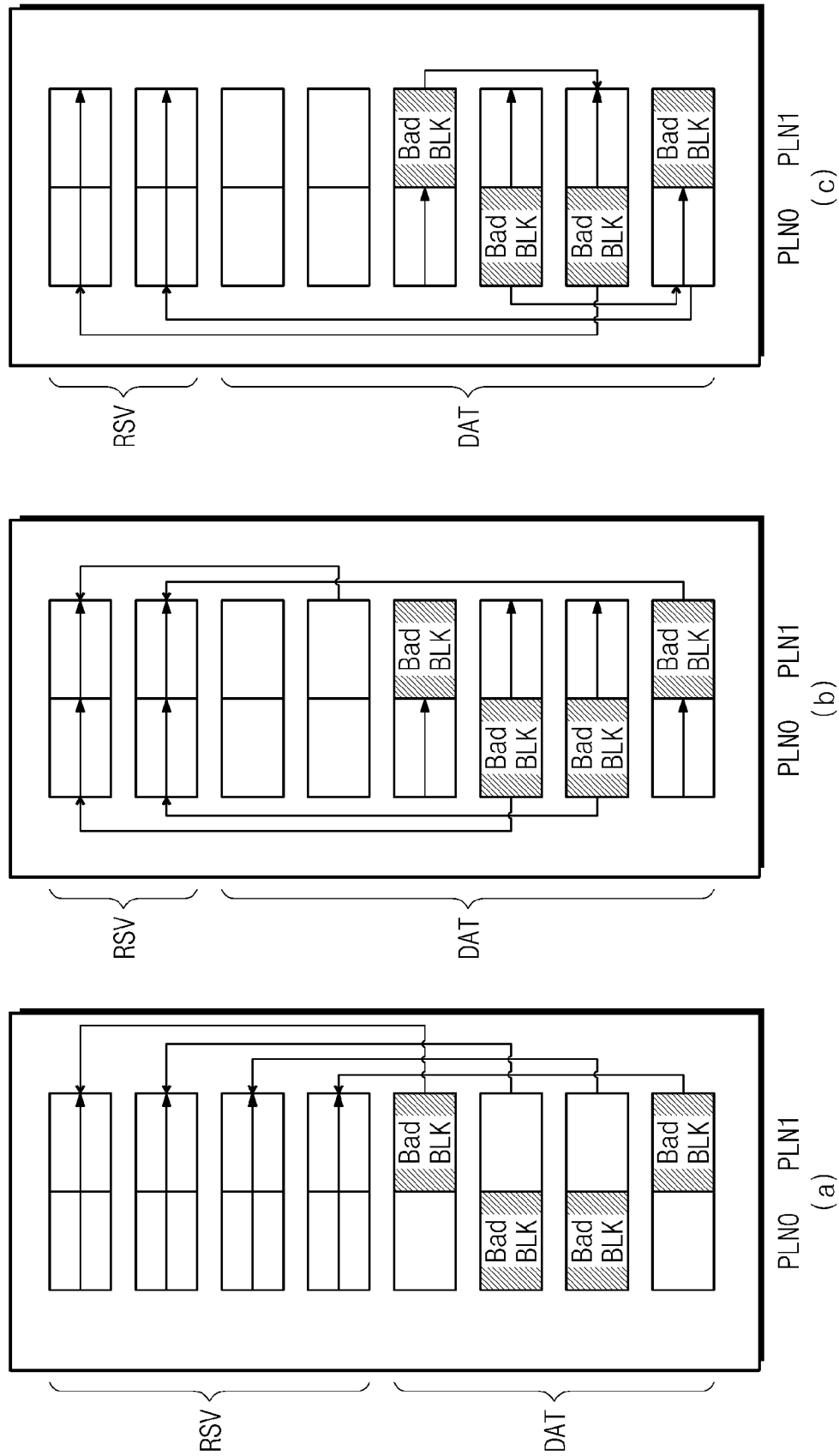

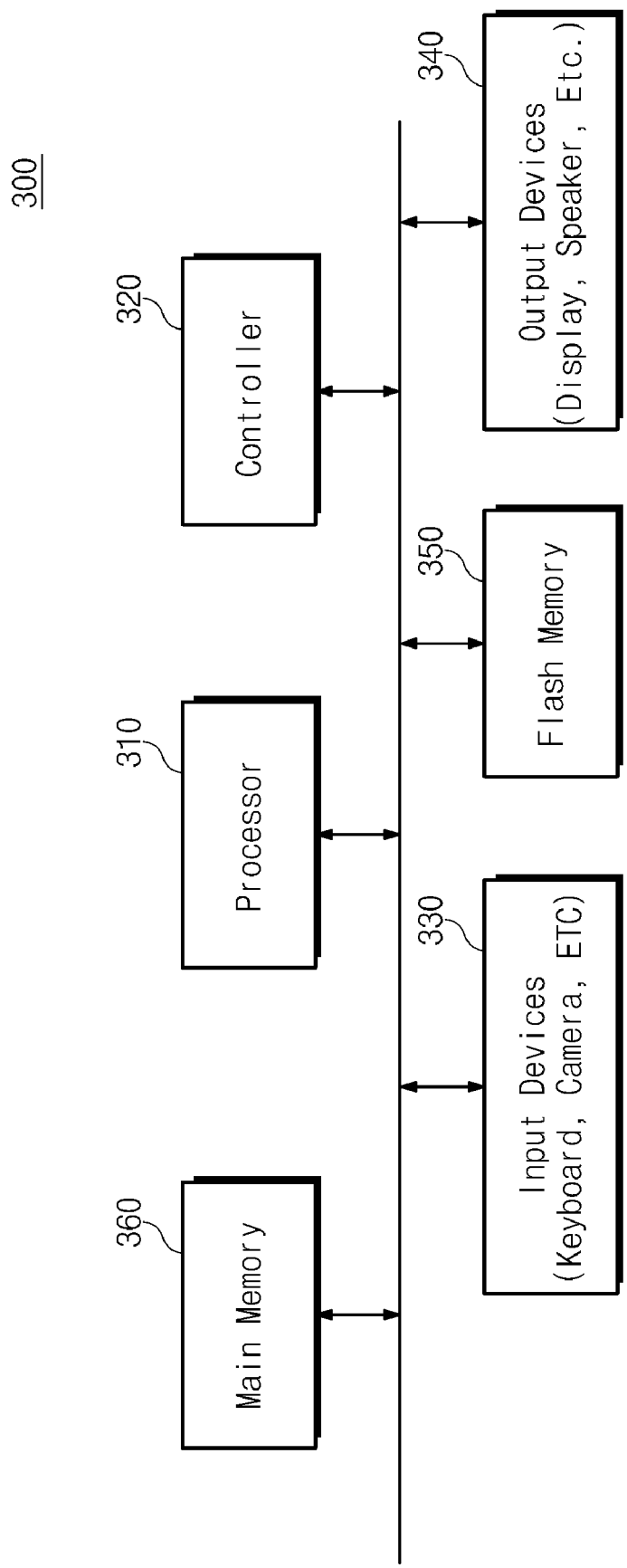

SEMICONDUCTOR MEMORY DEVICE AND BLOCK MANAGEMENT METHOD OF THE SAME

CROSS-REFERENCE TO RELATED APPLICATIONS

A claim of priority is made to Korean Patent Application No. 10-2007-0089547, filed on Sep. 4, 2007, the subject matter of which is hereby incorporated by reference.

BACKGROUND

The present invention relates to semiconductor memory devices. More particularly, the present invention is directed to a multi-plane semiconductor memory device and a block management method of the same.

Semiconductor memory devices are storage units capable of storing and releasing data, as needed. Semiconductor memory devices are generally classified as random access memories (RAMs) and read-only memories (ROMs). RAMs, called volatile memories, lose stored data when there is no power supply. ROMs, called nonvolatile memories, retain stored data even without power supply. Flash memories are currently widely used as a type of nonvolatile storage unit.

In a traditional flash memory, all memory blocks are located on a single plane. This is called single-plane structure. Erasing operations are performed in block units. In a flash memory having a single-plane structure, a command is available to a block unit in an erasing mode, and to a page unit in programming and reading modes.

For the purpose of enhancing performance of semiconductor memory devices, a multi-plane structure has been proposed. In a multi-plane semiconductor memory device, blocks are distributed over multiple planes. An advantage of such a multi-plane structure is that erasing, programming and reading operations can be simultaneously executed on blocks or pages, even when placed independently on different planes. Blocks operating at the same time are arranged successively over adjacent planes. Such an assembly of simultaneously operating blocks is referred to as a "multi-plane operation group."

FIGS. 1A and 1B are block diagrams respectively showing single and multiple plane structures. FIG. 1A illustrates the single plane structure, while the FIG. 1B illustrates the multiple plane (or multi-plane) structure.

As shown in FIG. 1A, the flash memory includes a single plane PLN0, having multiple blocks BLK0~BLKn-1. This architecture is referred to as "single plane structure." In the single plane structure, a flash operation is executed on a block by block basis. The flash operation may include programming, reading and erasing actions. In response to an external request for flash operations on the blocks BLK0 and BLK1, for example, a second flash operation OP2 is conducted for the second block BLK1 only after a first single flash operation OP1 is completed for the first block BLK0. In other words, a single flash operation is executed twice, respectively, for the two blocks BLK0 and BLK1.

The flash memory shown in FIG. 1B includes two planes PLN0 and PLN1. Each plane includes multiple blocks BLK0~BLKn-1. This architecture is referred to as "multi-plane structure." In the exemplary multi-plane structure illustrated in FIG. 1B, there are two planes, although it is understood that a multi-plane structure may include more than two planes.

In the multi-plane semiconductor memory, the blocks are dispersed on more than one plane. Further, simultaneous flash operations may be conducted for the blocks successively arranged over adjacent planes. In other words, a flash operation can be executed for multiple blocks at the same time in the multi-plane structure. Referring to FIG. 1B, responding to an external operation request for the blocks BLK0 and BLK1, for example, a multi-flash (or multi-plane) operation OP1 is executed once for both blocks BLK0 and BLK1. As a result, the two blocks BLK0 and BLK1 are treated at one time in the multi-plane operation OP1.

The multi-plane operation is referred to as an expansion of the single plane operation. For example, if the memory includes four planes, the programming operation can be carried out simultaneously for four adjacent pages over the four planes. In particular, data are first loaded into page buffers corresponding to the four pages on the four planes. After filling the four page buffers with data, the four pages on the four planes are respectively programmed at the same time. Thus, it is possible to shorten programming time, as compared to individually programming the pages.

As previously discussed, while the single plane semiconductor memory is operable with an on-block flash operation, the multi-plane semiconductor memory enables improved performance because it performs simultaneous flash operations for multiple blocks successively arranged over multiple planes adjacent to each other. Therefore, the multi-plane structure effectively enhances the performance of semiconductor memory devices.

However, when a bad block appears in a flash memory, it is necessary to detect and replace the bad block with a valid block in order to assure reliable performance of the flash memory. A bad block is one in/from which data cannot be stored/read successfully. Bad blocks may be included a flash memory, or generated later due to a variety of causes. A multi-plane semiconductor memory may be especially affected by replacement problems with respect to bad blocks.

SUMMARY

Embodiments of the present invention are directed to a semiconductor memory device and a block management method for assuring data fields and improving performance of the multi-plane semiconductor device. For example, a multi-plane semiconductor device according to various embodiments may use single and multiple replacement modes while repairing bad blocks.

An aspect of the present invention provides a block management method for a semiconductor memory device having a multi-plane structure. The semiconductor memory device includes adjacent planes divided into a reserve field and a data field, the planes including corresponding blocks forming a multi-plane operation group. The method includes determining whether the reserve field has free blocks corresponding to a unit of the multi-plane operation group, and conducting a first operation or a second operation based on the determination of whether the reserve field has the free blocks corresponding to the unit of the multi-plane operation group. Conducting the first operation includes replacing blocks of the data field with the free blocks of the reserve field in the unit of the multi-plane operation group. Conducting the second operation includes replacing a single block of the data field with a single free block of the reserve block.

In various embodiments, the method may further include conducting a third operation, including replacing the single block of the data field with a free block of valid blocks of the data field that have been replaced previously, according to whether the reserve field has the free blocks.

In various embodiments, the first operation may be performed when the free blocks in the unit of the multi-plane operation group are present in the reserve field. The second operation may be performed when the free blocks in the unit of the multi-plane operation group are absent in the reserve field and the single free block is present in the reserve field. The third operation may be performed when there are no free blocks in the reserve field.

In various embodiments, the reserve field may include at least one block for replacement of a bad block of the data field.

In various embodiments, the method may further include storing block mapping information. Also, the multi-plane operation may be performed in the unit of the multi-plane operation group.

Another aspect of the present invention provides a semiconductor memory device, including adjacent planes and a control module. The adjacent planes include a reserve field and a data field having multiple blocks. The blocks of each of the reserve and data fields are successively arranged over the adjacent planes to form a multi-plane operation group. The control module is configured to control the adjacent planes to conduct a first operation or a second operation in accordance with whether the reserve field includes free blocks corresponding to a unit of the multi-plane operation group. The first operation includes replacing blocks of the data field with free blocks of the reserve field in the unit of the multi-plane operation group. The second operation includes replacing one block of the data field with one free block of the reserve field.

In various embodiments, the control module may control the planes to conduct a third operation, which includes replacing one block of the data field with one free valid block of the data field that has been previously replaced, according to whether the reserve field has the free blocks.

In various embodiments, the control module may control the planes to conduct the first operation when the reserve field includes the free blocks corresponding to the unit of the multi-plane operation group. The control module may control the planes to conduct the second operation when the reserve field does not include the free blocks corresponding to a unit of the multi-plane operation group, but does include the one free block. The control module may control the planes to conduct the third operation when the reserve field does not include the free blocks corresponding to a unit of the multi-plane operation group.

In various embodiments, the blocks in the reserve field may be configured to replace bad blocks of the blocks in the data field.

In various embodiments, the control module may be configured to store block mapping information. Also, the multi-plane operation may be performed in the unit of the multi-plane operation group.

Another aspect of the present invention provides a memory card, including a semiconductor memory device and a controller configured to control the semiconductor memory device according to a block management method. The semiconductor memory device includes adjacent planes divided into a reserve field and a data field, the planes including corresponding blocks forming a multi-plane operation group. The block management method includes determining whether the reserve field has free blocks corresponding to a unit of the multi-plane operation group, and conducting a first operation or a second operation based on the determination of whether the reserve field has the free blocks corresponding to the unit of the multi-plane operation group. Conducting the first operation includes replacing blocks of the data field with the free blocks of the reserve field in the unit of the multi-plane operation group. Conducting the second operation includes replacing a single block of the data field with a single free block of the reserve block.

Another aspect of the present invention provides a memory card, including a semiconductor memory device and a controller configured to control the semiconductor memory device. The semiconductor memory device has adjacent planes and a control module. The adjacent planes include a reserve field and a data field having multiple blocks. The blocks of each of the reserve and data fields are successively arranged over the adjacent planes to form a multi-plane operation group. The control module is configured to control the adjacent planes to conduct a first operation or a second operation in accordance with whether the reserve field includes free blocks corresponding to a unit of the multi-plane operation group. The first operation includes replacing blocks of the data field with free blocks of the reserve field in the unit of the multi-plane operation group. The second operation includes replacing one block of the data field with one free block of the reserve field.

A further understanding of the embodiments of the present invention may be realized by reference to the remaining portions of the specification and the attached drawings.

BRIEF DESCRIPTION OF THE DRAWINGS

Non-limiting and non-exhaustive embodiments of the present invention will be described with reference to the attached drawings, wherein like reference numerals refer to like parts throughout the various figures unless otherwise specified, in which:

FIG. 5 is a flow chart showing a block management method, according to an illustrative embodiment of the present invention;

FIGS. 6A and 6B include block diagrams showing a sequence of replacing bad blocks, according to an illustrative embodiment of the present invention;

FIGS. 7A and 7B include block diagrams showing a sequence of replacing bad blocks, according to an illustrative embodiment of the present invention;

FIG. 9 includes block diagrams showing operation rates of block management in a semiconductor memory device, according to an illustrative embodiment of the present invention; and FIG. 10 is a block diagram of a computing system including the semiconductor memory device, according to an illustrative embodiment of the present invention.

DETAILED DESCRIPTION OF THE EMBODIMENTS

Figure 1A:
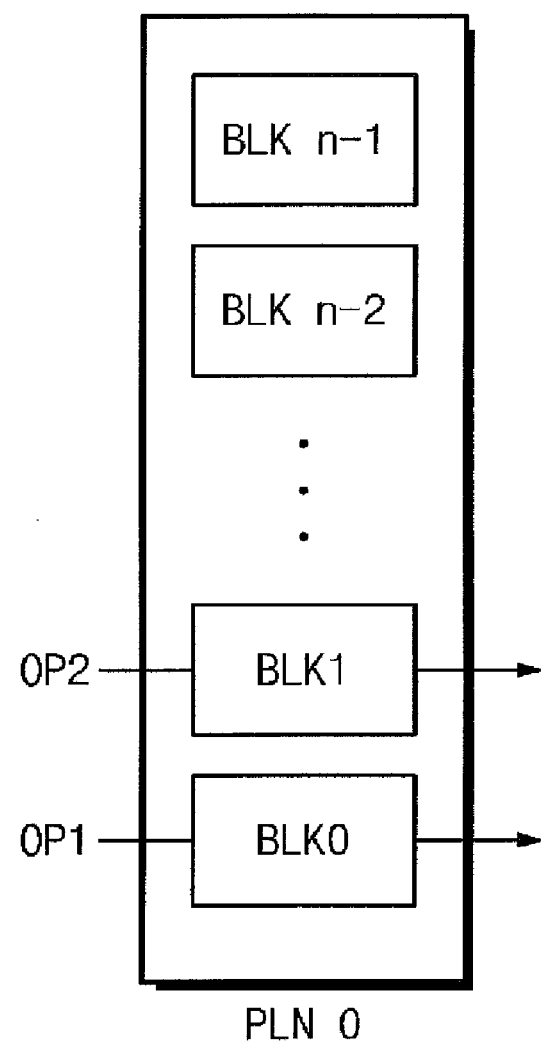
FIGS. 1A and 1B are block diagrams showing single and multiple plane structures, respectively.
Figure 1B:
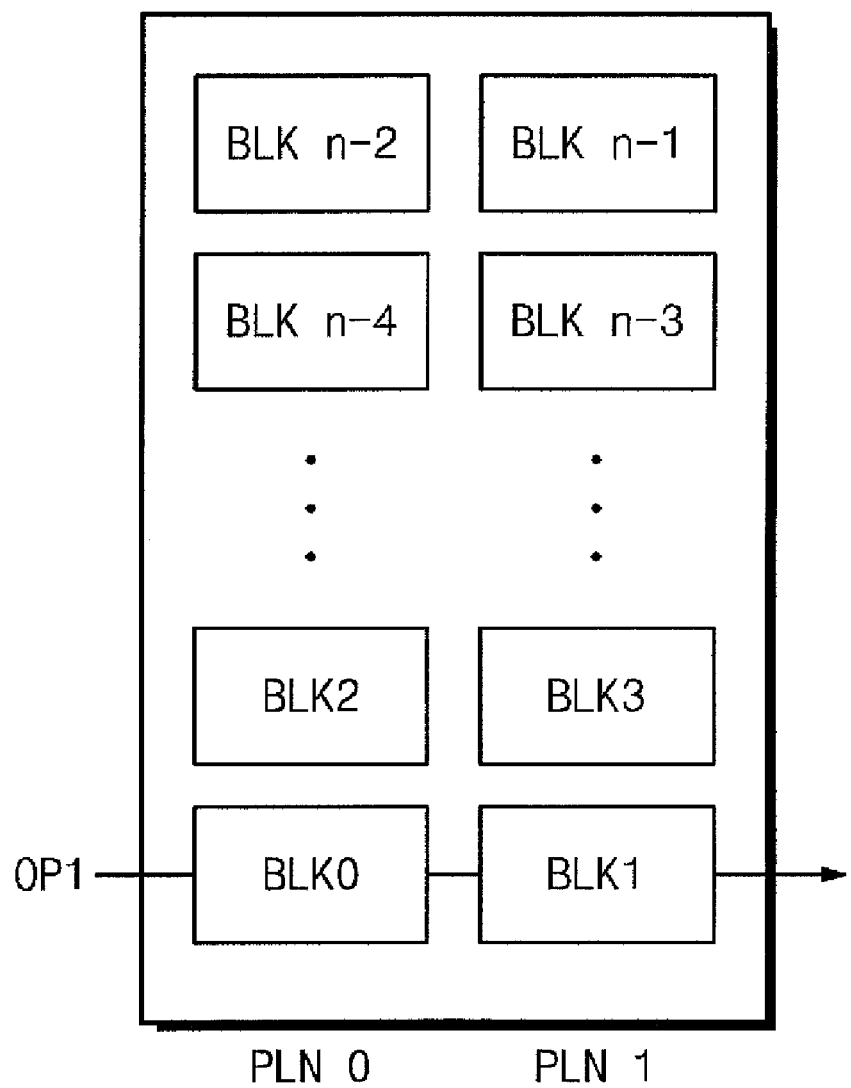

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

Bad blocks may be replaced in a multi-plane structure of a memory device in a variety of ways. FIGS. 2(a) through 2(d) are block diagrams showing a sequence of steps in which a bad block and a block adjacent to the bad block are simultaneously replaced, according to an illustrative embodiment of the present invention. This type of replacement will be referred to as "multiple replacement" or "multi-replacement."

Figure 2:
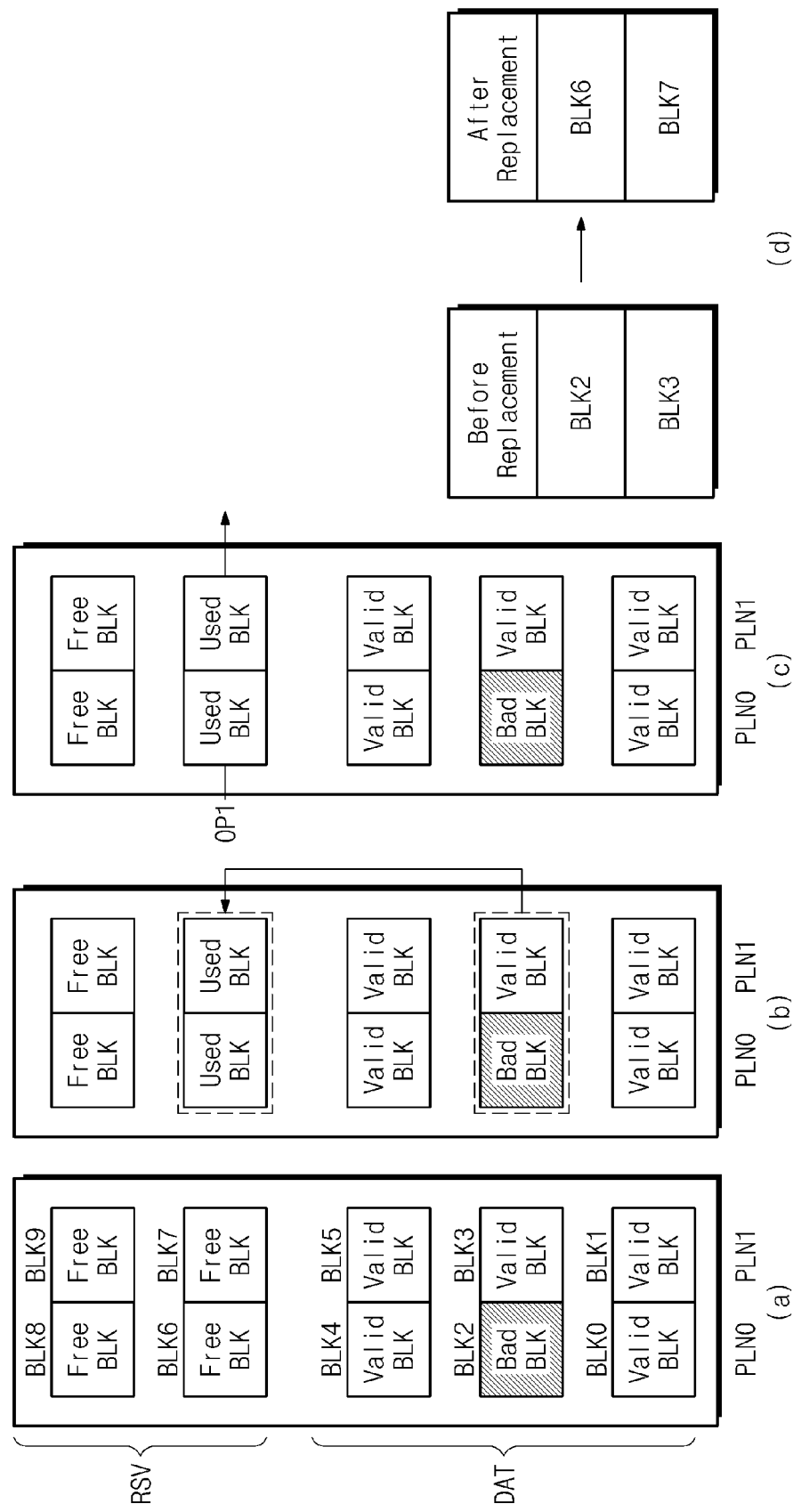
FIG. 2 includes block diagrams showing a sequence of replacing bad blocks, according to an illustrative embodiment of the present invention.

In the flash memory of FIG. 2(a), each of planes PLN0 and PLN1 is divisionally formed in a data field DAT and a reserve field RSV. The data field DAT is used for general user data and the reserve field RSV is used for replacing bad blocks. In the example shown in FIG. 2, the data field DAT includes six blocks BLK0~BLK5, while the reserve field RSV includes four blocks BLK6~BLK9. However, it is understood that the various embodiments of the present invention are not limited, and the numbers of blocks included in the data field DAT and reserve fields RSV may vary.

Referring FIG. 2(a), block BLK2 is assumed to be a bad block, while block BLK3 adjacent to BLK2 is assumed to be a valid block. In order to enhance reliability of the semiconductor memory device, the bad block is replaced with the valid block. FIG. 2(b) shows multi-replacement, in which the bad block BLK2 and the adjacent block BLK3 are replaced together.

Referring to FIG. 2(b), the blocks of the data field DAT, BLK2 and BLK3, are replaced with the blocks BLK6 and BLK7 of the reserve field RSV. After the replacement, mapping information indicating the replacement may be stored in a table, for example. In order to preserve the mapping information, even without power, the mapping information may be stored in the flash memory.

FIG. 2(d) shows an example of a mapping table indicating the replacement status of blocks. Referring to FIG. 2(d), the bad block BLK2 is replaced with the block BLK6 of the reserve field RSV. Thus, if there is an externally input command for accessing the block BLK2 (e.g., from a host), the block BLK6 is selected by referring to the mapping table.

FIG. 2(c) shows a feature of multi-plane operation after replacement of the bad block. As illustrated in FIG. 2(c), a flash operation OP1 is executed on the blocks BLK6 and BLK7 at the same time. This is more efficient than a single plane operation, which conducts a flash operation only on one unit block, in systemic performance. However, the block BLK3 is treated as being unavailable, although it is usable, as a practical matter. As a result, the available space for the data field DAT is reduced.

FIGS. 3(a) through 3(d) are block diagrams illustrating a sequence of replacing bad blocks independently, according to an illustrative embodiment of the present invention. Hereinafter, this replacement will be referred to as single replacement. FIGS. 3(a) through 3(d) show a semiconductor memory device that includes a bad block (e.g., BLK2), as in FIGS. 2(a) through 2(d).

Figure 3:
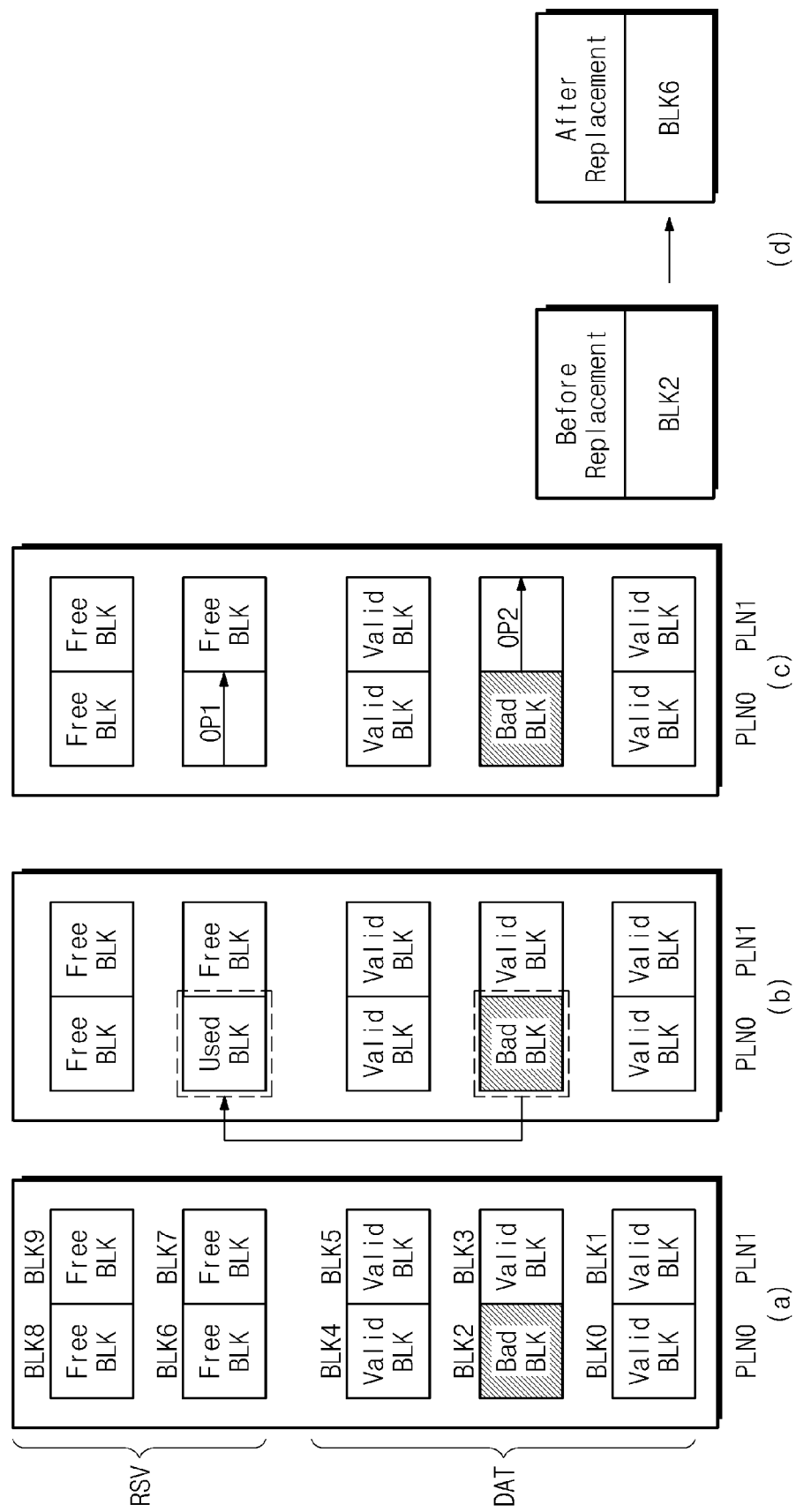
FIG. 3 includes block diagrams showing a sequence of replacing bad blocks, according to an illustrative embodiment of the present invention.

Referring FIG. 3(a), block BLK2 is assumed to be a bad block, while block BLK3 adjacent to BLK2 is assumed to be a valid block. A single replacement procedure, according to an embodiment, will be described with reference to FIG. 3(b). The bad block BLK2 of the data field DAT is independently replaced with block BLK6 of the reserve field RSV. After the replacement, corresponding mapping information is stored in a form of table.

FIG. 3(d) shows an example of a mapping table indicating the replacement status of blocks. Referring to FIG. 3(d), the bad block BLK2 of the data field DAT is replaced with the block BLK6 of the reserve field RSV. Thus, if there is an externally input command for accessing to the block BLK2 (e.g., from a host), the block BLK6 is selected by referring to the mapping table.

FIG. 3(c) shows a feature of flash operation after replacement of the bad block BLK2 with the valid block BLK6. When an operation command is input to the blocks BLK2 and BLK3, the flash operation is carried out on the blocks BLK6 and BLK3 based on reference to the mapping table. In this case, as the blocks BLK6 and BLK3 are not successively located over adjacent planes, the multi-plane operation cannot be executed. Therefore, two single plane operations OP1 and OP2 must be carried out, which may degrade systemic performance as compared to a multi-plane operation that executes to two blocks at a time, although there is an advantage of more providing space for the data field DAT since the valid block BLK3 may be used, even when the block BLK2 is bad.

Figure 4:
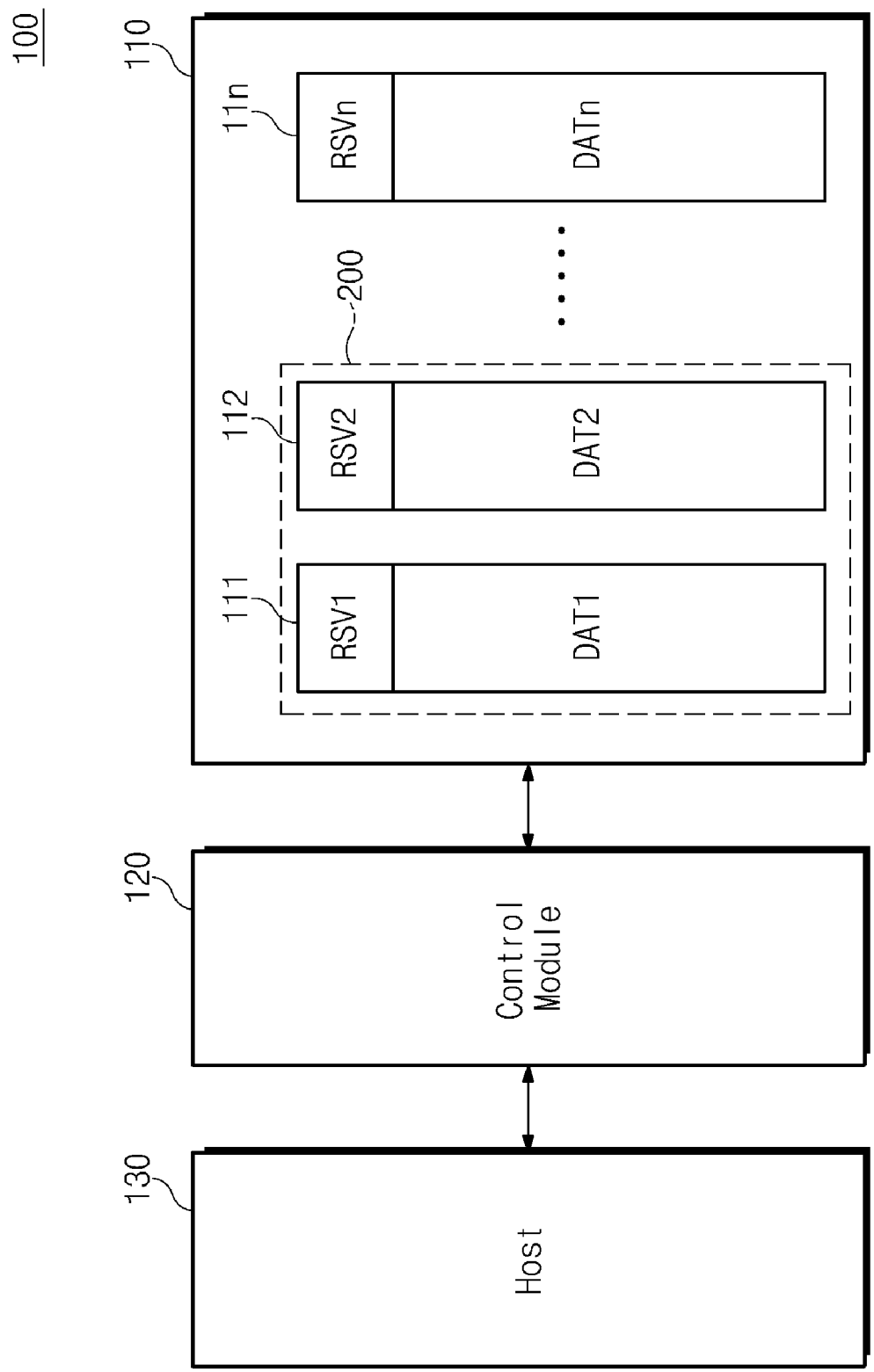
FIG. 4 is a block diagram showing a semiconductor memory device configured to perform block management, according to an illustrative embodiment of the present invention.

FIG. 4 is a block diagram showing a semiconductor memory device configured to perform block management, according to an illustrative embodiment of the present invention.

Referring to FIG. 4, the semiconductor memory device 100 includes a flash memory 110 and a control module 120. The same reference numbers are used to indicate the same components throughout the accompanying figures.

The flash memory 110 includes multiple planes divided into data fields DAT1~DATn and reserve fields RSV1~RSVn, respectively. Although not shown, each plane includes multiple blocks, and each block includes memory cells arranged in a matrix of rows (or word lines) and columns (or bit lines). However, the various embodiments of the present invention are not limited to this configuration. For instance, the sizes and dispositions of the data and reserve fields may vary in the semiconductor memory device, according to different embodiments.

In the illustrative embodiment, the multi-plane operation is conducted in units of two planes 200 (e.g., including planes 111 and 112). Thus, the multi-plane operation will be described with reference to a multi-plane operation group have a unit of two planes 200. However, it is understood that the multi-plane operation may be conducted in units of more than two planes, in various alternative embodiments.

A bad-block detection module (not shown) is used to find bad blocks. The bad-block detection module may be included in the control module 120, for example, or otherwise provided as an independent component in the semiconductor memory device 100. The bad-block detection module operates to find bad blocks according to general techniques, and so it will not be described in further detailed. Results of the bad block detection are transferred to the control module 120.

The control module 120 is configured to control overall operation of the semiconductor memory device 100. According to an embodiment of the present invention, the control module 120 controls a series of operations for replacing bad blocks with valid blocks. Also, although the control module 120 is shown as part of the semiconductor memory device 100, alternative embodiments of the present invention may not limited to this configuration. For example, the control module 120 may be located outside of the semiconductor memory device 100 in a flash memory card.

The control module 120 conducts an operation on a memory cell in an array of the flash memory 110 in response to a control signal received, for example, from a host 130. The control signal may include at least information about the kind of multi-plane operation, such a programming, reading or erasing, and information about planes to be processed by the multi-plane operation. Further, the control module 120 enables the mapping information to be stored in the mapping table. The mapping information is recorded in the mapping table. The mapping table is stored n a nonvolatile memory in order to retain the mapping information, even when there is no power supply. In various embodiments, the mapping table may be entirely or partly stored in the flash memory 110 or independently stored in an additional nonvolatile memory. The mapping information saved in the mapping table is referenced by the control module 120.

FIG. 5 is a flow chart of the block management method, according to an illustrative embodiment of the present invention. The block management method is described with respect to the semiconductor memory device shown 100 in the embodiment depicted in FIG. 4. In this embodiment, it is assumed that the multi-plane operation is executed on the two planes 200 (e.g., planes 111 and 112). Among the planes 111~11n shown in FIG. 4, the two adjacent planes 111 and 112 are referenced as an example for description purposes.

Referring to FIG. 5, a bad block is first detected in a collective data field DAT of the adjacent planes 200 (S210). In FIG. 4, the data field DAT would include the data fields DAT1 and DAT2 of the two planes 111 and 112, for example. Detection of the bad block may be performed by the bad-block detection module, for example, which transfers the detection results to the control module 120.

When a bad block is detected, it is determined whether there are two successive free blocks in a collective reserve field RSV of the adjacent planes 200 (S220). In FIG. 4, the reserve field RSV would include the reserve fields RSV1 and RSV2 of the two planes 111 and 112, for example. Here, successive blocks refer to blocks that are successively located over adjacent planes. For instance, blocks BLK6 and BLK7 of FIG. 2 correspond to the successive blocks in the collective reserve field. Since the multi-plane operation is conducted on the successive blocks, the successive blocks are referred to as a multi-plane operation group.

When it is determined that there are two successive free blocks in the reserve fields RSV1 and RSV2, the detected bad block and an adjacent block of the data fields DAT1 and DAT2 are respectively replaced with a valid block and an adjacent block of the reserve fields RSV1 and RSV2 (S230). The reason for replacing the bad block along with the adjacent block is to execute a multi-plane operation. After completing the block replacement, mapping status or information is written to the mapping table (S280). As in the case of the block mapping information, information regarding valid blocks may be stored in a nonvolatile memory. Here, "valid block" refers to a block in the data fields DAT1 and DAT2 that is replaced, along with an adjacent bad block, even though the block is available. The operation of bad block replacement is then finished.

When it is determined that there are not two successive free blocks in the reserve fields RSV1 and RSV2 (S220), it is determined whether there is one free block available in the reserve fields RSV1 and RSV2 (S240). When there is a free block, for example, in the reserve field RSV1 of block 111, only the bad block, e.g., BLK2, is replaced with the free block (S250). After the block replacement, the corresponding block mapping status is stored in the mapping table (S280), and then the operation of bad block replacement is terminated.

When it is determined that there are no single free blocks in the reserve fields RSV1 and RSV2 (S240), it is determined whether there is a free block available from the data fields DAT1 and DAT2 (S260). When there is a free block in the data field DAT2 of block 112, for example, the bad block, e.g., BLK2, is replaced with the free block (S270). For this detection, the information about valid blocks previously stored is referred to. In an embodiment, since a block adjacent to the bad block may be replaced along with the bad block for the multi-plane operation, even though the adjacent block is a valid block, it can be also used in replacing another bad block (S270). After replacing the bad block, corresponding block mapping information is written to the mapping table (S280), and then the operation of bad-block replacement is terminated. However, when it is determined that there no free blocks in the data fields DAT1 or DAT2 (S260), the operation of bad block replacement is terminated without replacing the bad block.

In summary, when two successive free blocks are present in the reserve fields RSV1 and RSV2, a bad block from the data fields DAT1 and DAT2 is replaced together with a block adjacent to the bad block in the multi-plane operation. When there are not successive free blocks in the reserve fields RSV1 and RSV2, the bad block is replaced independently with a free block in the reserve fields RSV1 or RSV2. Finally, when there are no free blocks in the reserve fields RSV1 and RSV2, the bad block is replaced with a free valid block of the data fields DAT1 or DAT2. Consequently, the data rate may be enhanced when multi-plane operation is performed, yet single spaces may be secured for data fields. This effect by various embodiments of the present invention will be described with reference to FIGS. 6A through 9, below.

Figure 6A:
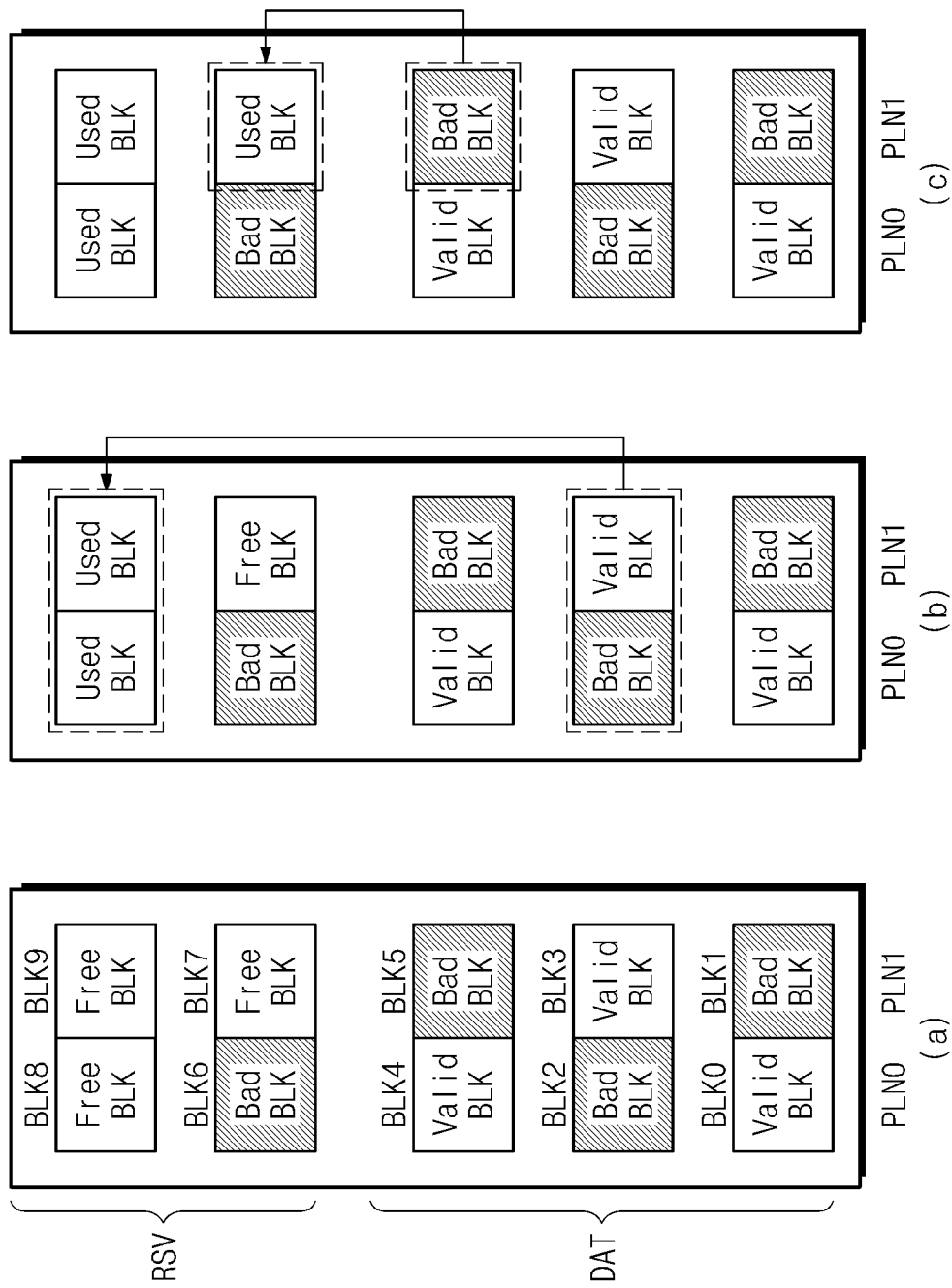

FIGS. 6A and 6B include block diagrams illustrating block management features of a semiconductor memory device, according to an illustrative embodiment of the present invention.

FIG. 6A(a) shows two planes PLN0 and PLN1 as a unit of multi-plane operation. In other words, the multi-plane operation is performed on the two blocks successively located over the two adjacent planes PLN0 and PLN1. The planes PLN0 and PLN1 include data and reserve fields DAT and RSV. For example, the data field DAT includes six blocks BLK0~BLK5 and the reserve field RSV includes four blocks BLK6~BLK9. It is assumed, for purposes of discussion, that the blocks BLK1, BLK2, BLK5 and BLK6 are bad blocks.

First, to replace the bad block BLK2, together with the block BLK3 adjacent to BLK2, two successive free blocks from the reserve field RSV are located. Referring to the example shown in FIG. 6A(a), there are two successive free blocks BLK8 and BLK9 in the reserve fields RSV. Thus, the blocks BLK2 and BLK3 are replaced with the free blocks BLK8 and BLK9, respectively. During this process, information about the valid block BLK3 is stored. The valid block information can be referenced for additional bad block replacement.

As described above, in order to replace the adjacent block BLK3 along with the bad block BLK2, two successive free blocks from the reserve field RSV are detected and used. As shown in FIG. 6A(b), there are no longer two successive free blocks in the reserve field RSV. Therefore, in order to replace an additional bad block BLKn of the data field DAT, a single free block is located from the reserve field RSV. For example, since there is a free block BLK7 in the reserve field RSV, as illustrated in FIG. 6A(c), the bad block BLK5 is replaced with the block BLK7.

Subsequently, in order to replace the bad block BLK1, it is determined whether there are two successive free blocks from the reserve field RSV. Referring to FIG. 6B(d), there are not two successive free blocks. Then, it determined whether there is one free block from the reserve field RSV. Again, referring to FIG. 6B(d), there also is not a single free block in the reserve block RSV. However, there is a usable (or available) block BLK3 in the data field DAT. Therefore, as shown in FIG. 6B(e), the bad block BLK1 is replaced with block BLK3 of the data field DAT.

FIG. 6B(f) shows a mapping table that stores the status of block replacements, according to an illustrative embodiment. Referring to FIG. 6B(f), blocks BLK1, BLK2, BLK3 and BLK5 are replaced with blocks BLK3, BLK8, and BLK9 and BLK7, respectively. Thus, when an external system, e.g., the host 130, applies a command for requesting access to block BLK1, for example, block BLK3 is selected through reference to the mapping table.

Figure 7B:
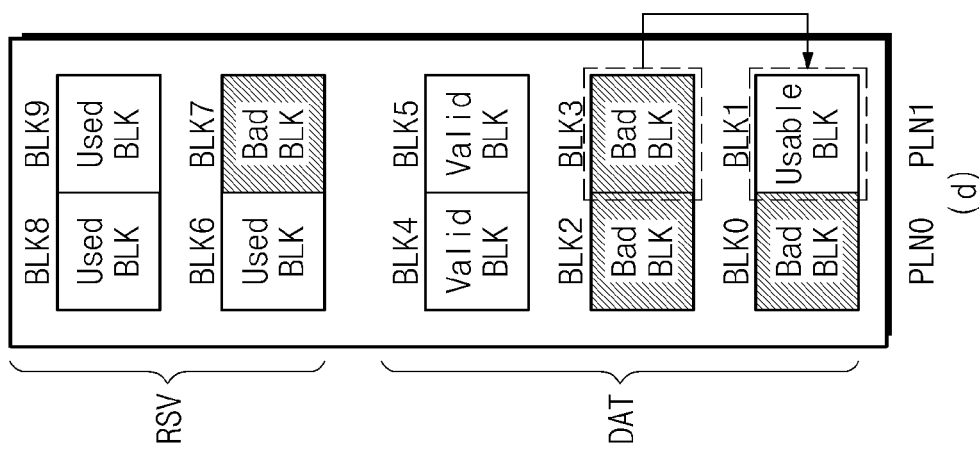

FIGS. 7A and 7B include block diagrams illustrating block management features of a semiconductor memory device, according to an illustrative embodiment of the present invention.

The FIG. 7A(a) shows two planes, PLN0 and PLN1, as a unit of multi-plane operation. The planes PLN0 and PLN1 include data and reserve fields DAT and RSV. For example, the data field DAT includes six blocks BLK0~BLK5 and the reserve field RSV includes four blocks BLK6~BLK9. It is assumed that BLK0, BLK2, BLK3 and BLK7 are bad blocks.

First, to replace the bad block BLK0 together with block BLK1 adjacent to BLK0, two successive free blocks from the reserve field RSV are located. Referring to the example shown in FIG. 7A(a), there are two successive free blocks BLK8 and BLK9. Thus, the blocks BLK0 and BLK1 are replaced with the free blocks BLK8 and BLK9, respectively, as shown in FIG. 7A(b). During this process, information about the valid block BLK1 is stored. The valid block information can be referenced for additional bad block replacement.

Next, in order to replace the bad blocks BLK2 and BLK3, an attempt is made to detect two successive free blocks from the reserve field RSV. Referring to FIG. 7A(b), there are not two successive free blocks in the reserve field RSV. Therefore, a single free block from the reserve field RSV is located. For example, since there is a free block BLK6 in the reserve field RSV, as illustrated in FIG. 7A(b), the bad block BLK2 is replaced with the block BLK6, as illustrated in FIG. 7A(c).

In order to replace the bad block BLK3, an attempt is made to find two successive free blocks from the reserve field RSV. Referring to FIG. 7B(c), there are not two successive free blocks. Then, an attempt is made to find a free block from the reserve field RSV. Referring to FIG. 7B(c), there is no single free block in the reserve block RSV. However, it is determined that there is a usable block BLK1 in the data field DAT. In this case, the bad block BLK3 is therefore replaced with block BLK1 of the data field DAT, as shown in FIG. 7B(d).

FIG. 7B(e) shows the mapping table that stores the status of block replacements. Referring to FIG. 7B(e), blocks BLK0, BLK1, BLK2 and BLK3 are replaced with BLK8, BLK9, BLK6 and BLK1, respectively. Thus, when an external system, e.g., the host 130, applies a command for requesting access to the block BLK1, for example, the block BLK9 is selected with reference to the mapping table.

Figure 8:
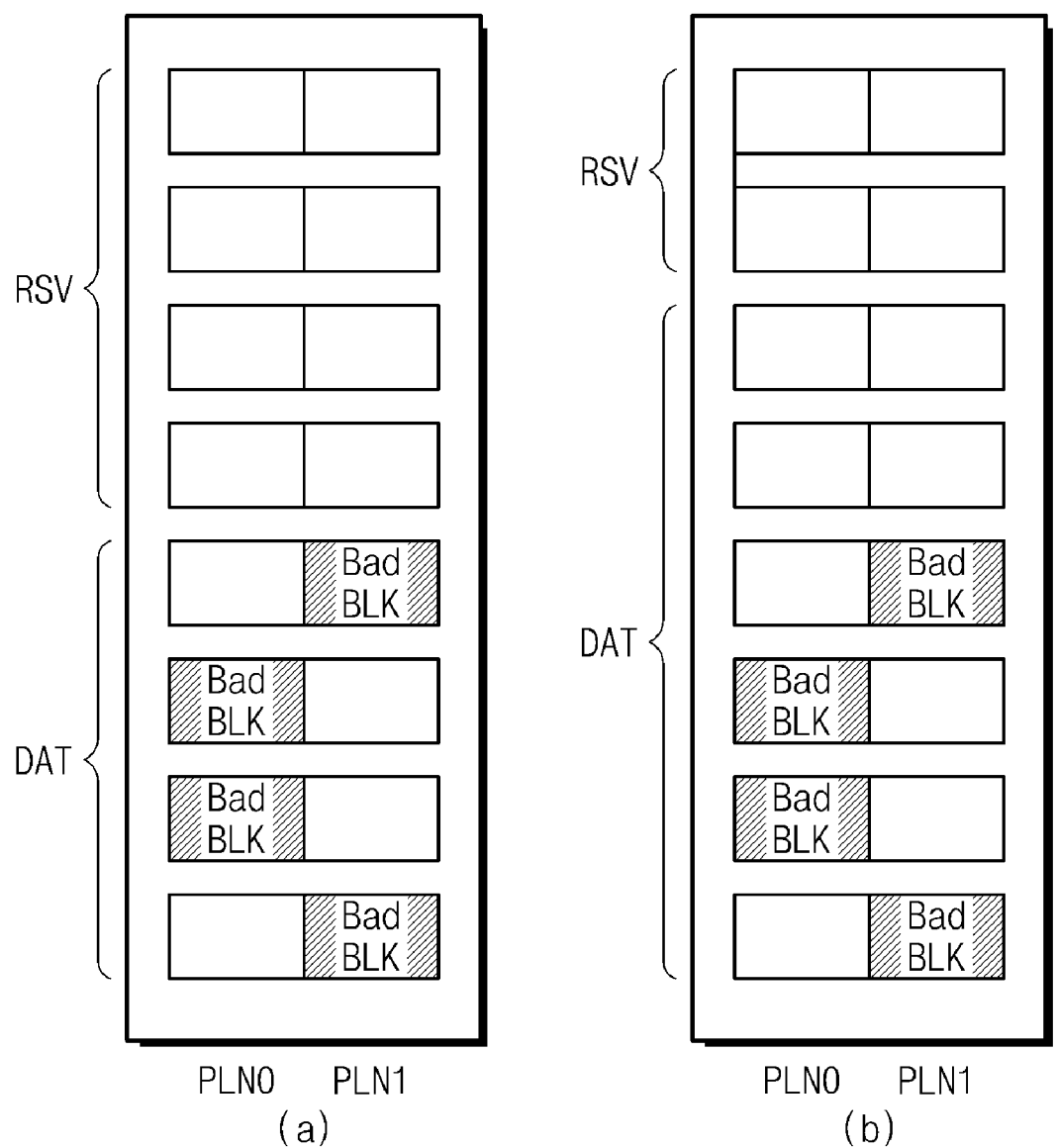
FIG. 8 includes block diagrams showing sizes of reserve fields for block management in a semiconductor memory device, according to an illustrative embodiment of the present invention.

FIG. 8 includes block diagrams showing variable sizes of reserve fields for block management in the semiconductor memory device, according to illustrative embodiments of the present invention.

The size of the data field DAT becomes smaller as the reserve field RSV becomes larger, as necessary for processing bad blocks. The worst case, which may arise from the multi-plane structure, as illustrated in FIG. 8(a), is the pattern in which bad blocks are all replaced without adjacency in the data field DAT. Table 1 comparatively shows sizes of the reserve field RSV according to conventional multi-replacement and replacement methods according to the present invention.

TABLE 1

| | Replacing bad block along with adjacent block (multi-replacement) | The present invention |
|---|---|---|
| Reserve field size for N bad blocks | N × the number of planes | N |

FIG. 8(a) shows a size of the reserve field RSV necessary for replacing bad blocks along with adjacent blocks (i.e., multi-replacement). Referring to FIG. 8(a), four bad blocks are separately located on different rows in the data field DAT. Since each bad block and corresponding adjacent block is replaced, the reserve field RSV has to include eight blocks, at least.

FIG. 8(b) shows a size of the reserve field RSV necessary for the replacing bad blocks, according to embodiments of the present invention. Referring to FIG. 8(b), when there are two successive free blocks in the reserve field RSV, a bad block is replaced along with its corresponding adjacent block (i.e., multi-replacement). Otherwise, when there are not two successive free blocks remaining in the reserve field RSV, the bad blocks are replaced individually by a free/valid block in the reserve field RSV or in the data field DAT (i.e., single replacement). In the case of single replacement, the reserve field RSV needs to have only four blocks in all. As the reserve field RSV becomes smaller in size, it is possible to make the data field DAT larger.

FIG. 9 includes block diagrams showing operation rates according to the block management process in the semiconductor memory device, according to illustrative embodiments of the present invention.

FIG. 9(a) shows an operation rate in the case of replacing bad blocks together with corresponding adjacent blocks (i.e., multi-replacement). Referring to FIG. 9(a), four multi-plane operations must be performed because the bad blocks are replaced along with corresponding adjacent blocks, thus increasing the operation rate. FIG. 9(b) shows an operation rate in the case of replacing bad blocks independently (i.e., single replacement). Referring to FIG. 9(b), since the bad block is simply replaced with a valid block, eight single plane operations are performed, which slows the operation rate.

FIG. 9(c) shows an operation rate according to the block management method, according to embodiments of the present invention. Referring to FIG. 9(c), since multiple and single replacements are carried out jointly with each other, the multi-plane operations are conducted two times and the single plane operations are conducted four times. Thus, the operation rate is faster than the case of replacing only the bad blocks (i.e., single replacement). As such, the joint use with the multiple and single replacements contributes to increasing the operation rate of the semiconductor memory device, and securing more spaces for data fields.

FIG. 10 is a block diagram of a computing system 300, including a semiconductor memory device, according to an illustrative embodiment of the present invention.

Referring to FIG. 10, the computing system 300 includes a processor 310, a controller 320, input devices 330, output devices 340, a flash memory 350 and a main memory 360. The solid lines and arrows denote data flows and/or a system bus through which commands is transferred.

In the computing system 300, according to an illustrative embodiment of the present invention, data are externally input through the input devices 330 (e.g., keyboard, camera, etc.). Input data include commands by users or multimedia data, such as image data taken by cameras, for example. Such input data may be stored in the flash memory 350.

The controller 320 operates to control the components of the computing system 300 in response to commands stored in the flash memory 350, for example. The processor 310 conducts processing operations in response to the controller 320. Processed results may be stored in the flash memory 350 and/or the main memory 360. The output devices 340 operate to output data from the flash memory 350 or the main memory 360, for example, in response to outputs of the controller 320. The output devices 340 provide perceptible patterns for users based on data stored in the flash memory 350. For example, the output devises 340 may include a display device and a speaker.

The flash memory 350 may be configured the same as the flash memory 110 shown in FIG. 4, for example. The processor 310, the controller 320, the input devices 330, the output devices 340 and the main memory 360 may constitute a host.

The flash memory 350 and/or the controller 320 can be mounted on the system 300 in accordance with various types of packaging. For instance, the flash memory 350 and/or the controller 320 may be mounted using any package type, e.g., Package-on-Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip-On-Board (COB), CERamic Dual In-line Package (CERDIP), Plastic Metric Quad Flat Pack (MQFP), Thin Quad Flat Pack (TQFP), Small Outline (SOIC), Shrink Small Outline Package (SSOP), Thin Small Outline (TSOP), Thin Quad Flat Pack (TQFP), System In Package (SIP), Multi-Chip Package (MCP), Wafer-level Fabricated Package (WFP), Wafer-level Processed Stack Package (WSP), or Wafer-level Processed Package (WSP).

Although not shown in FIG. 10, it is apparent to those skilled in the art that a power supply unit (not shown) is provided to the computing system 300. Also, if the computing system 300 is a kind of mobile apparatus, it may further include a battery (not shown) for supplying power. The performance and capacity of the computing system 300 will be improved in proportion to the enhanced performance and capacity of the flash memory 350.

Additionally, the semiconductor memory device is applicable to a solid state disk (SSD). In recent years, SSD products are featured as competitive solutions capable of substituting for hard disk drives (HDDs). Generally, SSDs have advantages over HDDs, which operate mechanically, in operation rate, external impact and power consumption.

According to embodiments of the present invention, data fields are assured, improving the performance of a multi-plane semiconductor device, because the multi-plane semiconductor device jointly uses single and multiple replacement modes in repairing bad blocks, and/or because the multi-plane semiconductor device uses the data field in replacing bad blocks with valid blocks.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A block management method for a semiconductor memory device having a multi-plane structure, the semiconductor memory device comprising a plurality of adjacent planes divided into a reserve field and a data field, the planes comprising a plurality of corresponding blocks forming a multi-plane operation group, the method comprising:
   determining whether the reserve field has free blocks corresponding to a unit of the multi-plane operation group;
   conducting one of a first operation and a second operation based on the determination of whether the reserve field has the free blocks corresponding to the unit of the multi-plane operation group,
   wherein conducting the first operation comprises replacing blocks at least one bad block and at least one valid block of the data field with the free blocks of the reserve field corresponding to the unit of the multi-plane operation group, and
   wherein conducting the second operation comprises replacing a single bad block of the data field with a single free block of the reserve block.

2. The method as set forth in claim 1, further comprising:
   conducting a third operation comprising replacing the single bad block of the data field with a free block of valid blocks of the data field that have been replaced previously, according to whether the reserve field has the free blocks.

3. The method as set forth in claim 1, wherein the first operation is performed when the free blocks corresponding to the unit of the multi-plane operation group are present in the reserve field.

4. The method as set forth in claim 1, wherein the second operation is performed when the free blocks corresponding to the unit of the multi-plane operation group are absent in the reserve field and the single free block is present in the reserve field.

5. The method as set forth in claim 2, wherein the third operation is performed when there are no free blocks in the reserve field.

6. The method as set forth in claim 1, wherein the reserve field comprises at least one block for replacement of a bad block of the data field.

7. The method as set forth in claim 1, further comprising: storing block mapping information.

8. The method as set forth in claim 1, wherein a multi-plane operation is performed in the unit of the multi-plane operation group.

9. A semiconductor memory device comprising:
   a plurality of adjacent planes including a reserve field and a data field, each of the reserve and data fields comprising a plurality of blocks, wherein the plurality of blocks of each of the reserve and data fields are successively arranged over the adjacent planes to form a multi-plane operation group; and
   a control module configured to control the plurality of adjacent planes to conduct one of a first operation or a second operation in accordance with whether the reserve field includes free blocks corresponding to a unit of the multi-plane operation group,
   wherein the first operation comprises replacing at least one bad block and at least one valid block of the data field with a plurality of free blocks of the reserve field corresponding to the unit of the multi-plane operation group, and wherein the second operation comprise replacing one bad block of the data field with one free block of the reserve field.

10. The semiconductor memory device as set forth in claim 9, wherein the control module controls the plurality of planes to conduct a third operation, which comprises replacing one bad block of the data field with one free valid block of the data field that has been previously replaced, according to whether the reserve field has the free blocks.

11. The semiconductor memory device as set forth in claim 9, wherein the control module controls the plurality of planes to conduct the first operation when the reserve field includes the free blocks corresponding to the unit of the multi-plane operation group.

12. The semiconductor memory device as set forth in claim 9, wherein the control module controls the plurality of planes to conduct the second operation when the reserve field does not include the free blocks corresponding to a unit of the multi-plane operation group, but does include the one free block.

13. The semiconductor memory device as set forth in claim 10, wherein the control module controls the plurality of planes to conduct the third operation when the reserve field does not include the free blocks corresponding to a unit of the multi-plane operation group.

14. The semiconductor memory device as set forth in claim 9, wherein the plurality of blocks in the reserve field are configured to replace bad blocks of the plurality of blocks in the data field.

15. The semiconductor memory device as set forth in claim 9, wherein the control module is configured to store block mapping information.

16. The semiconductor memory device as set forth in claim 9, wherein a multi-plane operation is performed in the unit of the multi-plane operation group.

17. A memory card comprising:
a semiconductor memory device; and
a controller configured to control the semiconductor memory device in accordance with the method as set forth in claim 1.

18. A memory card comprising:
a semiconductor memory device as set forth in claim 9; and
a controller configured to control the semiconductor memory device.

* * * * *